(12) United States Patent  
Mos et al.

(10) Patent No.: US 8,972,031 B2
(45) Date of Patent: Mar. 3, 2015

(54) CONTROL METHOD AND APPARATUS

(75) Inventors: Everhardus Cornelis Mos, Best (NL); Birgitt Noëlle Cornelia Liduine Hepp, Waalre (NL); Jasper Thijs Menger, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 227 days.

(21) Appl. No.: 13/042,928

(22) Filed: Mar. 8, 2011

(65) Prior Publication Data

US 2012/0059505 A1  Mar. 8, 2012

Related U.S. Application Data

(60) Provisional application No. 61/315,696, filed on Mar. 19, 2010.

(51) Int. Cl.
*G05B 11/01* (2006.01)
*G03F 7/20* (2006.01)

(52) U.S. Cl.
CPC .................................. *G03F 7/70483* (2013.01)
USPC .................................................. 700/20; 700/9

(58) Field of Classification Search
USPC ............................................ 700/9, 28, 96, 108
See application file for complete search history.

(56) References Cited

U.S. PATENT DOCUMENTS 6,842,659 B2 * 1/2005 Parikh et al. ................... 700/121
2004/0126004 A1 * 7/2004 Kikuchi ......................... 382/141

FOREIGN PATENT DOCUMENTS

EP  1 628 164 A2  2/2006

* cited by examiner

*Primary Examiner* — Carlos Ortiz Rodriguez
(74) *Attorney, Agent, or Firm* — Sterne, Kessler, Goldstein & Fox P.L.L.C (57) ABSTRACT

A higher-level controller can correct measured metrology data with residual error values as reported by a lower-level controller. This results in a more accurate process disturbance estimate. A method of control obtains, based on measurement sample definition, a first process variable of a system under control, determines a residual error using the first process variable and a first set point, controls the system using the residual error, obtains, based on the same sample definition, a second process variable, and adjusts the second process variable using the residual error. The method may also include determining, using the adjusted second process variable, one or more first set points for controlling the system by the low-level controller that may vary in correspondence with the sample definition.

14 Claims, 7 Drawing Sheets

CONTROL METHOD AND APPARATUS

CROSS REFERENCE TO RELATED APPLICATIONS

This applications claims benefit under 35 U.S.C. 119(e) to U.S. Provisional Application No. 61/315,696, filed Mar. 19, 2010, which is incorporated by reference herein in its entirety.

BACKGROUND

1. Field of the Invention

The present invention relates to methods of control and control apparatus usable, for example, in the manufacture of devices by lithographic techniques.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

In known control systems in manufacturing tools such as scanners, lower-level controllers are assumed to regulate exactly to set points given by higher-level controllers without a remaining residual error. For example the wafer stages are assumed to exactly follow the desired route, e.g., set-point. These lower-level controllers only report a summary of the residual error over the whole field or wafer. This data is only used for troubleshooting and monitoring purposes.

The assumption that a controller regulates exactly to target is fundamentally incorrect. In the prior art the remaining residual errors have been neglected, but with tightening specifications, for example on lithography performance, even small errors will influence the performance of process control loops.

SUMMARY

Therefore, what is needed is an effective system and method to address and overcome the effects of residual errors over a whole field or wafer.

In an embodiment of the present invention, there is provided a method of control including obtaining, based on a measurement sample definition, a first process variable of a system under control, and determining a first error using said first process variable and a first set point. The method continues by controlling the system using the determined first error and obtains, according to said measurement sample definition, a second process variable to correct or adjust the second process variable using the determined first error.

In a further embodiment of the present invention, there is provided a control apparatus consisting of a first controller that is configured to obtain, based on measurement sample definition, a first process variable of a system under control, and determine a first error using the first process variable and a first set point. The apparatus also controls the system using the determined first error and includes a second controller that is configured to obtain, according to said measurement sample definition, a second process variable to correct the second process variable using the determined first error.

In another embodiment of the present invention, there is provided a lithographic apparatus consisting of a first controller that is configured to obtain, based on a measurement sample definition, a first process variable of a system under control, and determine a first error using the first process variable and a first set point. The apparatus also controls the system using the determined first error and includes a second controller that is configured to obtain, according to said measurement sample definition, a second process variable to correct the second process variable using the determined first error.

In another embodiment of the present invention, there is provided an article of manufacture including a computer-readable medium having instructions stored thereon, execution of which by a computing device causes the computing device to perform operations consisting of obtaining, based on a measurement sample definition, a first process variable of a system under control, and determining a first error using the first process variable and a first set point, and controlling the system using the determined first error, and further obtaining, according to the measurement sample definition, a second process variable, and correcting the second process variable using the determined first error.

Further embodiments, features, and advantages of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate the present invention, and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which may be read and executed by one or more processors. A machine-readable medium can include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Figure 1:
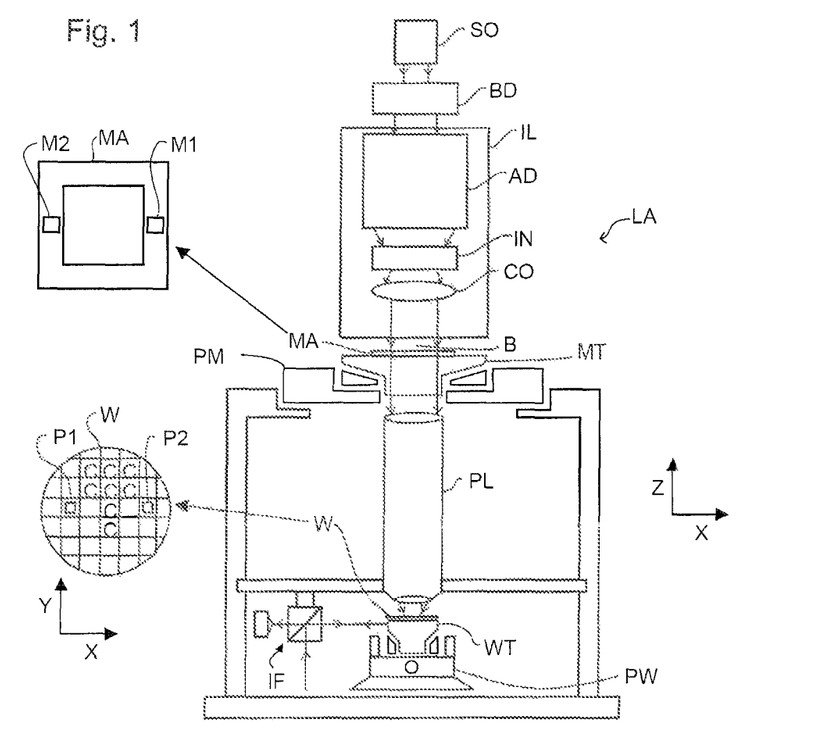
FIG. 1 depicts a lithographic apparatus.

FIG. 1, according to an embodiment of the present invention, schematically depicts a lithographic apparatus. The apparatus includes an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions.

The tilted mirrors impart a pattern in a radiation beam, which is reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables and for example, two or more mask tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent, which are commonly referred to as σ-outer and σ-inner, respectively, of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
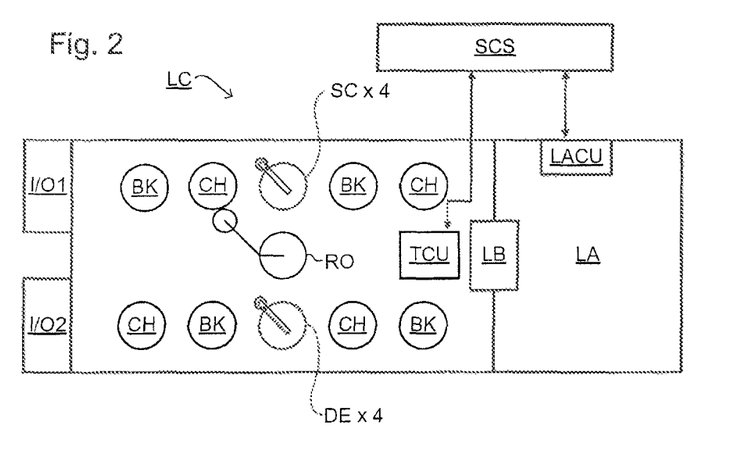
FIG. 2 depicts a lithographic cell or cluster.

As shown in FIG. 2, according to an embodiment of the present invention, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments, for example, can be made to exposures of subsequent substrates, especially if the inspection can be done soon and fast enough that other substrates of the same batch are still to be exposed. Also, already exposed substrates may be stripped and reworked to improve yield, or possibly be discarded, thereby avoiding performing exposures on substrates that are known to be faulty. In a case where only some target portions of a substrate are faulty, further exposures can be performed only on those target portions that are deemed to be non-faulty.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast as in there is only a very small difference in refractive index between the parts of the resist that have been exposed to radiation and those that have not, while not all inspection apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

Figure 3:
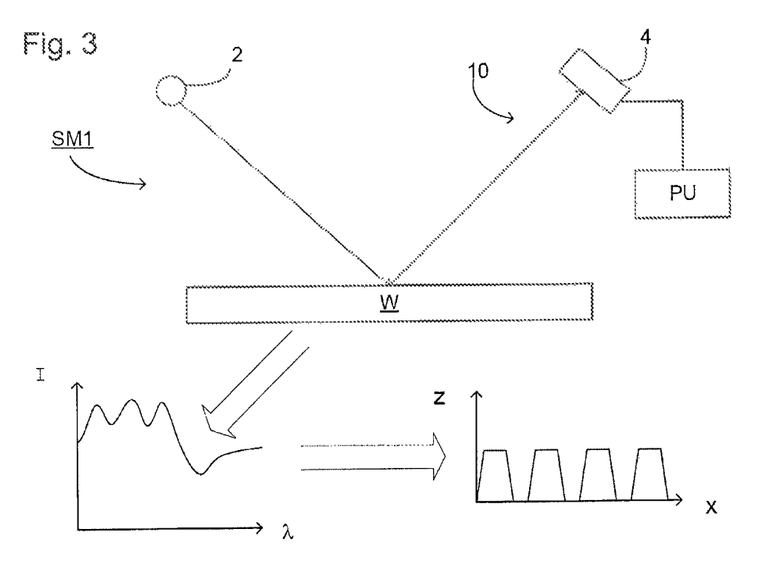
FIG. 3 depicts a first scatterometer.

FIG. 3, according to an embodiment of the present invention, depicts a scatterometer that can be used in the present invention. It comprises a broadband (white light) radiation projector 2 that projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
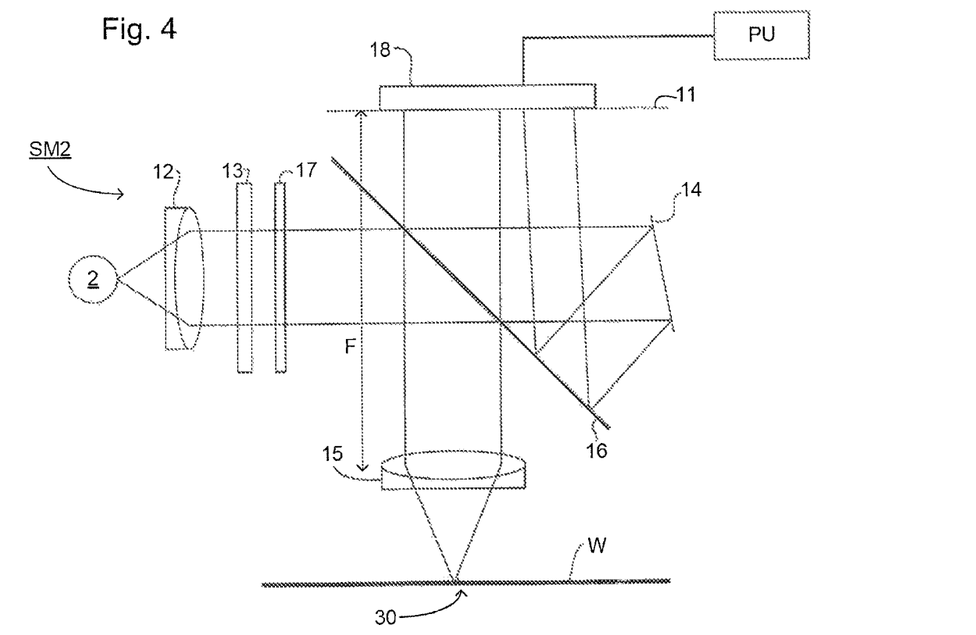
FIG. 4 depicts a second scatterometer.

Another scatterometer that may be used with the present invention is shown in FIG. 4, according to an embodiment of the present invention. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), for example, preferably at least about 0.9 and more preferably at least about 0.95. Immersion scatterometers may even have lenses with numerical apertures over 1. The reflected radiation then transmits through partially reflecting surface 16 into a detector 18 in order to have the scatter spectrum detected. In one example, the detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, for example, 405-790 nm, or even lower, such as 200-300 nm. The interference filter can be tunable rather than comprising a set of different filters. A grating could be used instead of interference filters.

The detector 18 can measure the intensity of scattered light at a single wavelength (or narrow wavelength range), the intensity separately at multiple wavelengths or integrated over a wavelength range. Furthermore, the detector can separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths, and therefore a wide range of colors is possible, which gives a large Etendue, allowing the mixing of multiple wavelengths. The plurality of wavelengths in the broadband preferably each has a bandwidth of $\Delta\lambda$ and a spacing of at least $2\Delta\lambda$ (i.e., twice the bandwidth). A plurality of "sources" of radiation can be different portions of an extended radiation source that have been split using fiber bundles. In this way, angle resolved scatter spectra can be measured at multiple wavelengths in parallel. A 3-D spectrum, for example, such as wavelength and two different angles can be measured, which contains more information than a 2-D spectrum. This allows more information to be measured that increases metrology process robustness. This is described in more detail in European Patent No. 1,628,164A, which is incorporated by reference herein in its entirety.

The target 30 on substrate W can be a 1-D grating, which is printed such that after development, the bars are formed of solid resist lines. The target 30 may be a 2-D grating, which is printed such that after development, the grating is formed of solid resist pillars or vias in the resist. The bars, pillars, or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

A key component of accurate lithography is an increased ability to control lithography scanners and scanning functionality. Note, when referring to "scanners" it should be appreciated that this encompasses all the scan modes and functionality described herein, and other scanning functionalities. Improvements to the scanner's focus and overlay, e.g., layer-to-layer alignment, uniformity have recently been achieved by the applicant's Baseliner™ scanner stability module, leading to an optimized process window for a given feature size and chip application, enabling the continuation the creation of smaller, more advanced chips.

When a lithography system is first installed, it must be calibrated to ensure optimal operation. However, over time, system performance parameters will drift. A small amount of drift can be tolerated, but too much drift and the system will go out of specification. Consequently manufacturers are required to stop production periodically for re-calibration. Calibrating the system more frequently gives a bigger process window, but at the cost of more scheduled downtime.

The scanner stability module greatly reduces these production stoppages. Instead, it automatically resets the system to a pre-defined baseline each day. To do this it retrieves standard measurements taken from a monitor wafer using a metrology tool. The monitor wafer is exposed using a special reticle containing special scatterometry marks. From that day's measurements, the scanner stability module determines how far the system has drifted from its baseline. It then calculates wafer-level overlay and focus correction sets. The lithography system then converts these correction sets into specific corrections for each exposure on subsequent production wafers.

For volume production, it is desirable to have full flexibility when assigning layers for exposure to a scanner. The alternative, layer-scanner dedication would put monthly output capacity at risk, since any small disturbance of the litho cluster directly shows up in the output of that month. One known approach to overcome this risk is by so called, e.g., overlay, grid matching. All scanner grids are intentionally offset a little, such that all scanners more or less have the same, e.g., on average, grid for overlay. This grid is often referred to as 'holy' or 'golden' grid. Each product layer can now be exposed on each scanner of the same type. This 'golden' grid is exposed and etched onto so called 'reference wafers'. If these 'golden' matching wafers are used as the baseline for overlay stability control instead of random monitoring wafers, overlay grid matching and long-term stability can be achieved in a single automated step.

Figure 5:
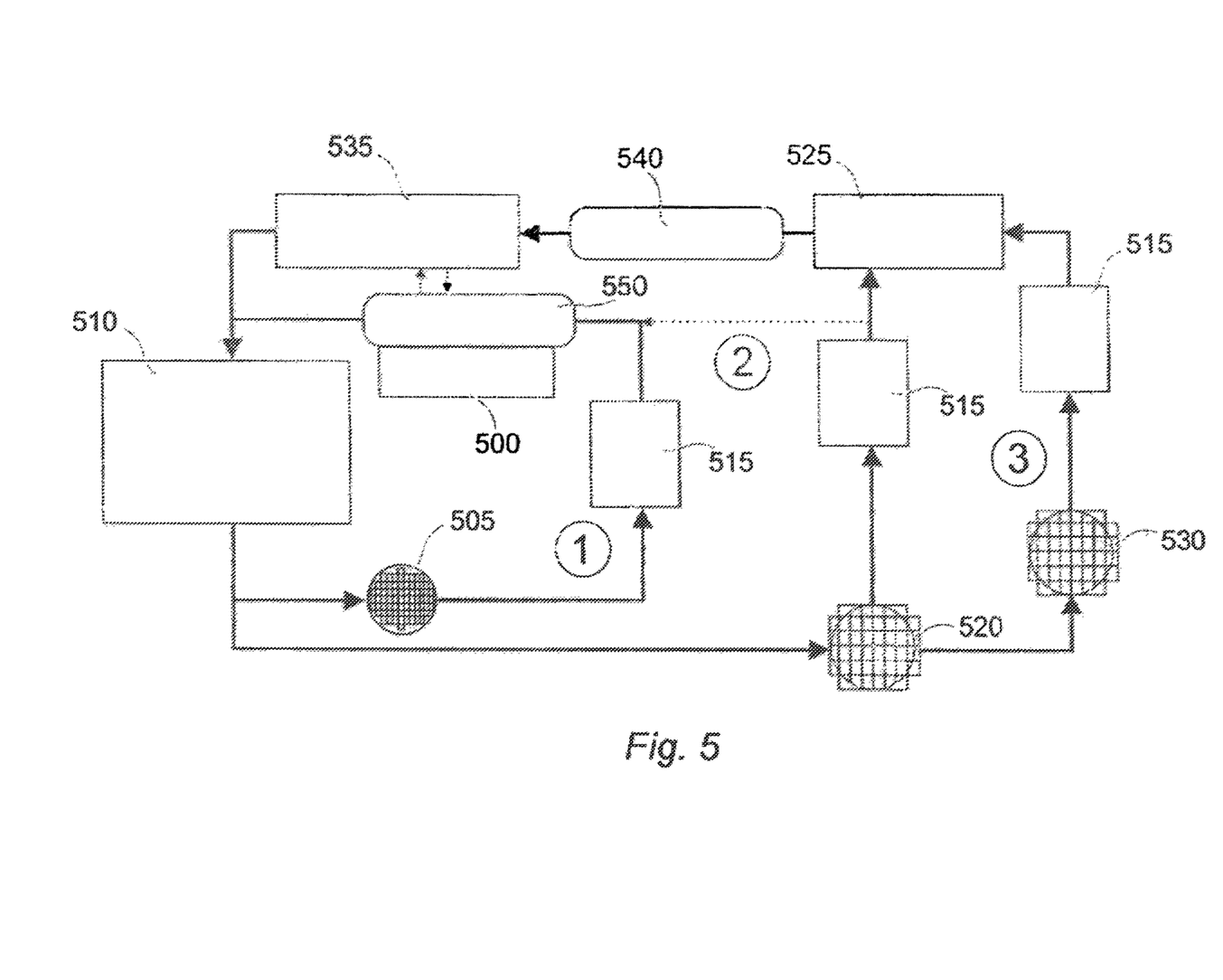
FIG. 5 illustrates the control loops in a lithographic process utilizing a scanner stability module.

FIG. 5, according to an embodiment of the present invention, depicts an overall lithography and metrology system incorporating a scanner stability module 500. For example, the scanner stability module 500 may also consist of a server based application. Shown are three main process control loops. The first loop provides the local scanner control using the scanner stability module 500 and monitor wafers. The monitor wafer 505 is shown being passed from the main lithography unit 510, having been exposed to set the baseline parameters for focus and overlay. At a later tine, metrology unit 515 reads these baseline parameters, which are then interpreted by the scanner stability module 500 so as to calculate correction routines 550 that are passed to the main lithography unit 510, and used when performing further exposures.

The second, e.g., Advanced Process Control (APC), loop is for local scanner control on-product, e.g., determining focus, dose, and overlay. The exposed product wafer 520 is passed to metrology unit 515 and then onto the APC module 525. Data from the metrology unit 515 is again passed to the scanner stability module 500. Process corrections 540 are made before the Manufacturing Execution System (MES) 535 takes over, providing scanner control to the main lithography unit 510, in communication with the scanner stability module 500.

The third loop is to allow metrology integration into the second APC loop (e.g., for double patterning). The post etched wafer 530 is passed to metrology unit 515 and then onto the APC module. The loop continues the same as with the second loop.

Figure 6:
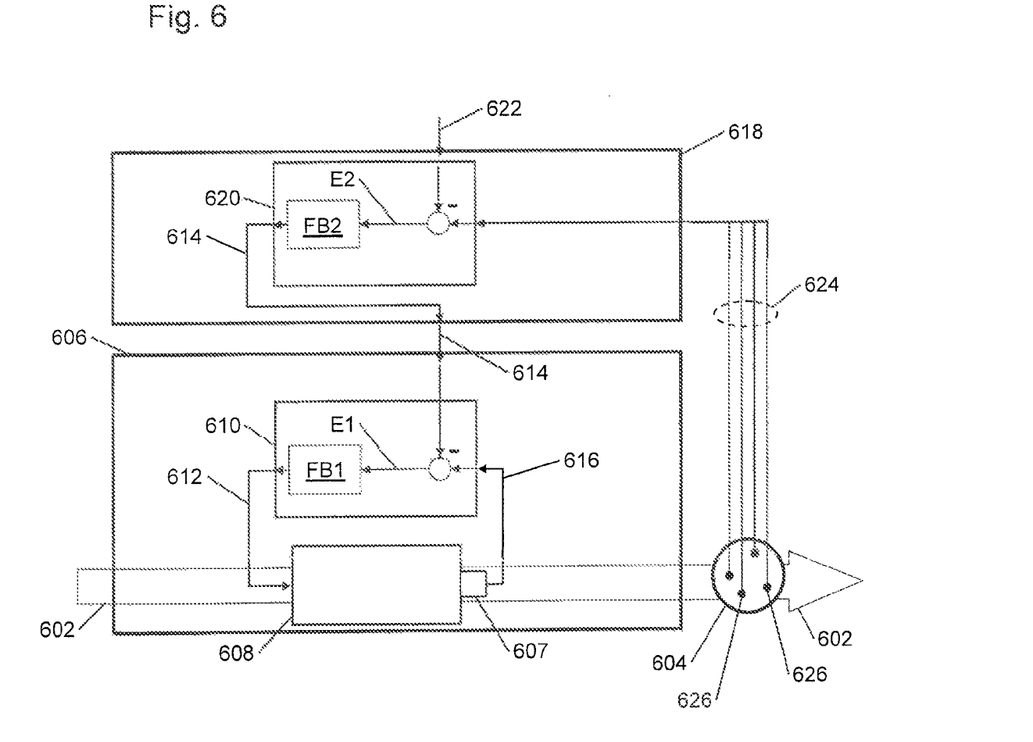
FIG. 6 illustrates a scanner controller and process control configuration.

FIG. 6 illustrates a scanner controller and process control configuration. The flow 602 of a wafer 604 is shown in a lithographic process using a scanner. A low-level control loop 606 has a low-level sensor 607 measuring the system under control 608 and a controller 610. The controller 610 operates via a feedback mechanism FB1 to move an actuator 612 using a low-level residual error E1 that is determined using a low-level set point 614 and a low-level process variable signal 616, which is sensor data from the low-level sensor 607.

The set point 614 is provided by a high-level control loop 618 that has a uses a high-level sensor (not shown) to perform measurements on the wafer 604 output from the system under control 608 and a controller 620. The controller 620 operates to determine the low-level set point 614 using a high-level residual error E2 that is itself determined using a high-level set point 622 and a high-level process variable signal 624, which may be metrology data from a high-level sensor such as a scatterometer. The determined low-level set point 614 is provided to the low-level controller 610 via a feedback mechanism FB2. The metrology data 624 arises from measurements by the scatterometer at localities 626 in the wafer 604.

Figure 7:
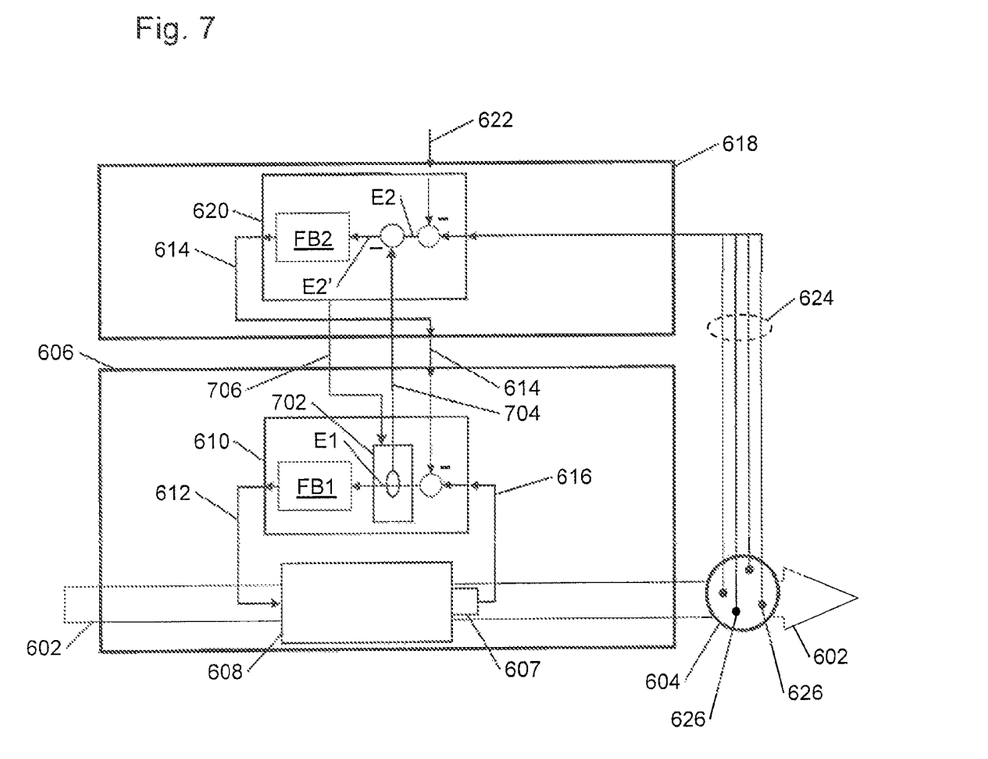
FIG. 7 illustrates a scanner controller and process control configuration, according to an embodiment of the present invention.

FIG. 7, according to an embodiment of the present invention, illustrates a scanner controller and process control configuration according to an embodiment of the present invention. Most elements of FIG. 7 are labeled the same as in FIG. 6 where they represent the same features.

Predetermined measurement locations of the plurality of measurements by the low-level sensor are passed down as a sample definition 706 to the low-level control loop and used to determine where the low-level sensor measurements are performed.

FIG. 7 also shows a module 702 for determining residuals E1 of the low-level measurements that are fed back 704 to the high-level control loop 618 so that the high-level controller 620 corrects the high-level process variable signal 624 and determines the set point 614 by reference to the fed-back residuals. The low-level residual errors E1 are determined from measurements by the low-level sensor according to the sample definition at the defined measurement localities 626, e.g., areas of the wafer. The metrology data 624 arising from measurements by the scatterometer at the same localities 626 on the wafer 604, also according to the same sample definition, is input to the high-level control loop 618. Then the high-level controller 620 determines set points for use at the measurement localities 626 that vary in correspondence with the sample definition using the fed-back low-level residual errors E1, and the metrology data 624. The set point may vary in between the measurement locations specified by the sample definition. The correction to the high-level process variable signal, e.g., metrology data, 624 may be done by adjusting the metrology data 624 before determining the high-level residual error E2. Alternatively, this may be done afterwards, by subtracting the fed-back low-level residual errors E1 from the high-level residual error E2 to obtain an adjusted high-level residual error E2'.

Thus, in an embodiment of the present invention, a low level controller (e.g., stage control) reports the residual errors, as measured with the corresponding sensor, for example, interferometer data, on a predefined sample definition, for example, a number of points on the wafer/in the field.

The scanner controller 610 in FIG. 7 receives a sample definition 706 from the higher-level controller 620. This sample definition will typically be a number of positions on the wafer. The high-level controller 620 could be some on-wafer overlay control such as one using a scanner stability module described above with reference to FIG. 5. It should be noted that the present invention is not limited to such scanner stability module type of control, nor is it limited to scatterometry type metrology.

The higher-level controller can now use the error data to improve the overall, e.g., lithographic, process control performance in a number of ways, discussed below as first and second examples with regards to FIGS. 8 and 9.

In a first example, a higher-level controller, e.g., in the stage control example, this might be an on-product overlay controller, can correct the measured sensor data with the residual error values as reported by the lower-level controller. This results in a more accurate process disturbance estimate.

Figure 8:
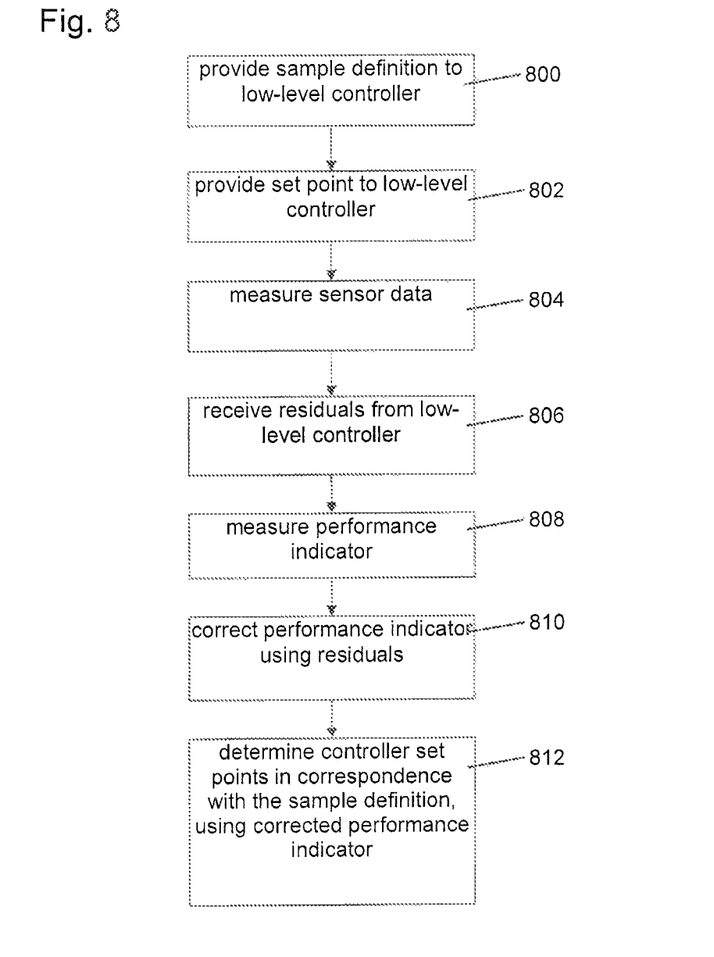
FIG. 8 is a flow chart illustrating a method, according to an embodiment of the present invention.

FIG. 8, according to an embodiment of the present invention, illustrates a flow chart according to an embodiment of the present invention. First a sample definition, for example defining locations across the wafer, is provided 800 to the low-level controller. The initial set point is provided 802 to the low-level controller. After measurements 804 of the low-level sensor data in accordance with the sample definition, residuals, as a function of position on the wafer, are received 806 from the low-level controller. A performance indicator, e.g., metrology data, is measured 808 by the metrology tool, in accordance with the sample definition, at the same positions on the wafer. Corrections or adjustments are made 810 to the performance indicator using the residuals. Controller set points are determined 812 that vary as a function of position on the wafer, using the corrected performance indicator. The determined set points can be used in the next instance of the control task, for example the next wafer or wafer lot.

In a second example, a higher-level controller can track the stochastic properties of the residual error data of a number of lower-level controllers to weigh the use of each controller. For example, in the stage example it may be possible to weigh the use of reticle and wafer stages to get to a set point. If a higher-level controller finds out that one of the two is noisier, it can adjust the weighed use of the two.

Figure 9:
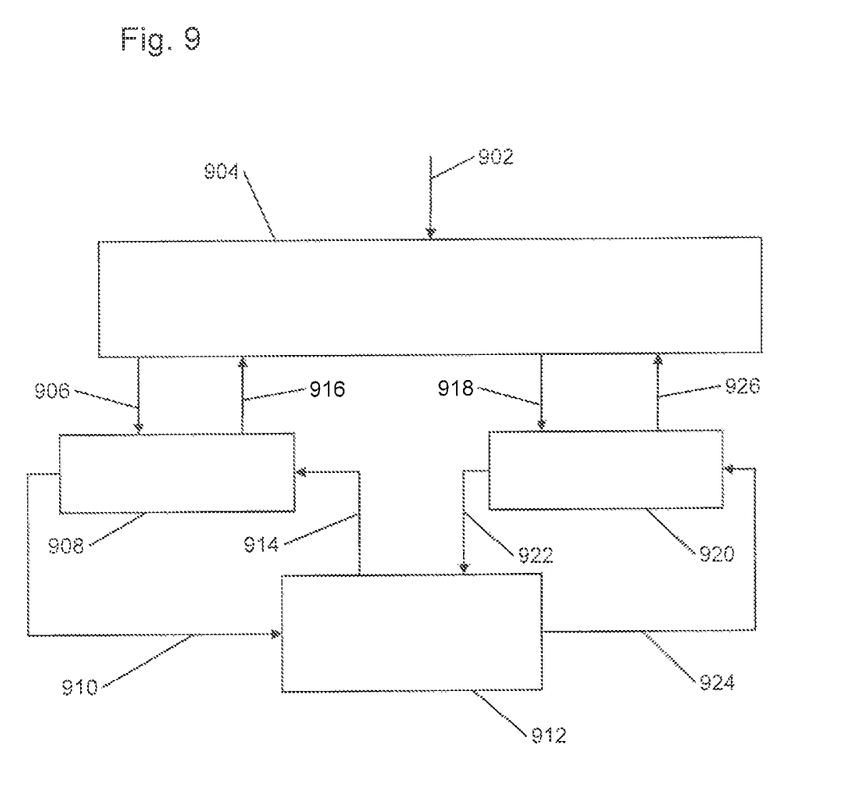
FIG. 9 illustrates a high-level controller with multiple low-level controllers, according to an embodiment of the present invention.

FIG. 9, according to an embodiment of the present invention, illustrates a high-level controller with multiple low-level controllers in accordance with an embodiment of the present invention. A performance objective set point 902 is provided to the high-level controller 904. The high-level controller 904 provides a set point 906 to a low-level controller 908, which sends actuator moves 910 to control the system under control 912. Sensor data 914 is received by the low-level controller 908, which feeds back residual errors 916 to the high-level controller 904. The high-level controller 904 also provides a set point 918 to a second low-level controller 920, which sends its own actuator moves 922 to control the system under control 912. Sensor data 924 is received by the second low-level controller 920, which feeds back its residual errors 926 to the high-level controller 904.

In anther example, residual error can relate to sensor data that is not directly related to the primary control task of the lower level controller. The error/sensor data can have information that is useful for a higher level controller. A possible example is ILIAS (Integrated Lens Interferometry At Scanner) data that is used in lens control, but contains information that is valuable for higher-level controllers e.g., CD (trough pitch) control.

There may be multiple higher-level controllers, each with set points for different performance objectives (e.g., overlay or CD). The residuals reported from a lower-level controller of one of the high level controllers can be used in multiple high-level controllers.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic, and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

For example, software functionalities of a computer system involve programming, including executable codes, may can be used to implement the above described inspection methods. The software code can be executable by a general-purpose computer. In operation, the code and possibly the associated data records can be stored within a general-purpose computer platform. At other times, however, the software may can be stored at other locations and/or transported for loading into an appropriate general-purpose computer system. Hence, the embodiments discussed above involve one or more software products in the form of one or more modules of code carried by at least one machine-readable medium. Execution of such codes by a processor of the computer system enables the platform to implement the functions in essentially the manner performed in the embodiments discussed and illustrated herein.

As used herein, terms such as computer or machine "readable medium" refer to any medium that participates in providing instructions to a processor for execution. Such a medium can take many forms, including but not limited to, non-volatile media, volatile media, and transmission media. Non-volatile media include, for example, optical or magnetic disks, such as any of the storage devices in any computer(s) operating as discussed above. Volatile media include dynamic memory, such as main memory of a computer system. Physical transmission media include coaxial cables, copper wire, and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read or send programming codes and/or data. Many of these forms of computer readable media may be involved in carrying one or more sequences of one or more instructions to a processor for execution.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building storing blocks illustrating the implementation of specified functions and relationships thereof. The boundaries of these functional building storing blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method, comprising:
   obtaining, using a first controller, a first process variable based on a measurement sample definition;
   determining, using the first controller, a first residual error over a wafer based on the first process variable and a first set point, wherein at least the first process variable and the first set point are input parameters of the first controller;
   controlling, using the first controller, a system based on the first residual error;
   obtaining, using a second controller, a second process variable based on the measurement sample definition;
   adjusting, using the second controller, the second process variable based on the first residual error;
   determining, using the second controller, a second set point based on the adjusted second process variable;
   feeding back, using the second controller, the second set point to the first controller; and
   determining, using the first controller, a second residual error, the second residual error being determined by the first controller based on the second set point.

2. The method of claim 1, wherein the second set point is determined to vary in correspondence with the measurement sample definition.

3. The method of claim 1, further comprising:
   determining, using the second controller, a third residual error based on the adjusted second process variable and a third set point,
   wherein the determining of the second set point is based on the third residual error.

4. The method of claim 1, further comprising:
   determining, using the second controller, a third residual error based on the second process variable and a third set point,
   wherein the adjusting of the second process variable comprises adjusting the third residual error based on the first residual error,
   wherein the determining of the second set point is based on the adjusted third residual error.

5. The method of claim 1, further comprising controlling the system based on the first set point.

6. The method of claim 1, wherein the measurement sample definition comprises a plurality of measurement locations with respect to a substrate.

7. A control apparatus, comprising:
   a first controller configured to:
      obtain, based on a measurement sample definition, a first process variable of a system under control;
      determine a first residual error over a wafer based on the first process variable and a first set point, wherein at least the first process variable and the first set point are input parameters of the first controller; and control the system based on the first residual error; and
a second controller configured to:
obtain, based on the measurement sample definition, a second process variable;
adjust the second process variable based on the first residual error;
determine a second set point based on the adjusted second process variable; and
feed back the second set point to the first controller, wherein the first controller is further configured to determine a second residual error based on the second set point.

8. The control apparatus of claim 7, wherein the second controller is further configured to determine the second set point to vary in correspondence with the measurement sample definition.

9. The control apparatus of claim 7, wherein the second controller is further configured to:
determine a third residual error based on the adjusted second process variable and a third set point; and
determine the second set point based on the third residual error.

10. The control apparatus of claim 7, wherein the second controller is further configured to:
determine a third residual error based on the second process variable and a third set point;
adjust the third residual error based on the first residual error in order to adjust the second process variable; and
determine the second set point based on the adjusted third residual error.

11. The control apparatus of claim 7, wherein the first controller is further configured to control the system based on the first set point.

12. The control apparatus of claim 7, wherein the measurement sample definition comprises a plurality of measurement locations with respect to a substrate.

13. A lithographic apparatus, comprising:
a first controller configured to:
obtain, based on a measurement sample definition, a first process variable of a system under control;
determine a first residual error over a wafer based on the first process variable and a first set point, wherein at least the first process variable and the first set point are input parameters of the first controller; and
control the system based on the first residual error; and
a second controller configured to:
obtain, based on the measurement sample definition, a second process variable;
adjust the second process variable based on the first residual error;
determine a second set point based on the adjusted second process variable; and
feed back the second set point to the first controller, wherein the first controller is further configured to determine, a second residual error based on the second set point.

14. A non-transitory computer-readable medium having instructions stored thereon, execution of which by a computing device causes the computing device to perform operations comprising:
obtaining, using a first controller, a first process variable of a system under control based on a measurement sample definition;
determining, using the first controller, a first residual error over a wafer based on the first process variable and a first set point, wherein at least the first process variable and the first set point are input parameters of the first controller;
controlling, using the first controller, the system based on the first residual error;
obtaining, using a second controller, a second process variable based on the measurement sample definition;
adjusting, using the second controller, the second process variable based on the first residual error;
determining, using a second controller, a second set point based on the adjusted second process variable;
feeding back, using the second controller, the second set point to the first controller; and
determining, using the first controller, as second, residual error, the second residual error being determined by the first controller based on the second set point.

* * * * *

UNITED STATES PATENT AND TRADEMARK OFFICE
CERTIFICATE OF CORRECTION

PATENT NO.       : 8,972,031 B2
APPLICATION NO.  : 13/042928
DATED            : March 3, 2015
INVENTOR(S)      : Mos et al.

Page 1 of 1

It is certified that error appears in the above-identified patent and that said Letters Patent is hereby corrected as shown below:

In the claims

Column 16, line 39, claim 14 after "controller," delete "as" and insert --a--.

Column 16, line 39, claim 14 after "second" delete ",".

Signed and Sealed this
Seventeenth Day of November, 2015

Michelle K. Lee
*Director of the United States Patent and Trademark Office*